United States Patent [19]
Böttge et al.

[11] Patent Number: 5,615,476
[45] Date of Patent: Apr. 1, 1997

[54] METHOD FOR PRODUCING IDENTITY CARDS HAVING ELECTRONIC MODULES

[75] Inventors: Horst Böttge, Geretsried; Wolfgang Gauch, Otterfing; Joachim Hoppe; Yahya Haghiri, both of München, all of Germany

[73] Assignee: Giesecke & Devrient GmbH, Munich, Germany

[21] Appl. No.: 328,652

[22] Filed: Oct. 25, 1994

[30] Foreign Application Priority Data

Oct. 26, 1993 [DE] Germany ............... 43 36 501.9

[51] Int. Cl.⁶ ................................................. H05K 3/30
[52] U.S. Cl. ................................................. 29/832
[58] Field of Search ................................. 29/832, 827

[56] References Cited

U.S. PATENT DOCUMENTS

| | | | |
|---|---|---|---|
| 3,931,922 | 1/1976 | Jackson et al. | 29/827 X |
| 4,100,675 | 7/1978 | Landsittel | 29/827 |
| 4,460,825 | 7/1984 | Haghiri-Tehrani et al. | 29/827 X |
| 4,746,392 | 5/1988 | Hoppe | 29/827 X |
| 4,829,666 | 5/1989 | Haghiri-Tehrani et al. | 29/827 X |
| 4,850,105 | 7/1989 | Nakajima et al. | 29/827 X |
| 5,057,461 | 10/1991 | Fritz | 29/827 X |
| 5,134,773 | 8/1992 | LeMaire et al. . | |
| 5,365,655 | 11/1994 | Rose | 29/827 |

FOREIGN PATENT DOCUMENTS

| | | | |
|---|---|---|---|
| 2-237044 | 9/1990 | Japan | 29/827 |
| 3-125445 | 5/1991 | Japan | 29/827 |

*Primary Examiner*—Carl J. Arbes
*Attorney, Agent, or Firm*—Hazel & Thomas, P.C.

[57] ABSTRACT

The invention relates to a method for producing chip cards having electronic modules. The prior art discloses different production methods for such chip cards wherein the particular electronic module used has a special structure. In contrast, a method is now presented for producing chip cards having electronic modules that uses a standardized electronic module which is adapted to the production technique for the card in a last method step and connected with the card body by the selected technique.

9 Claims, 4 Drawing Sheets

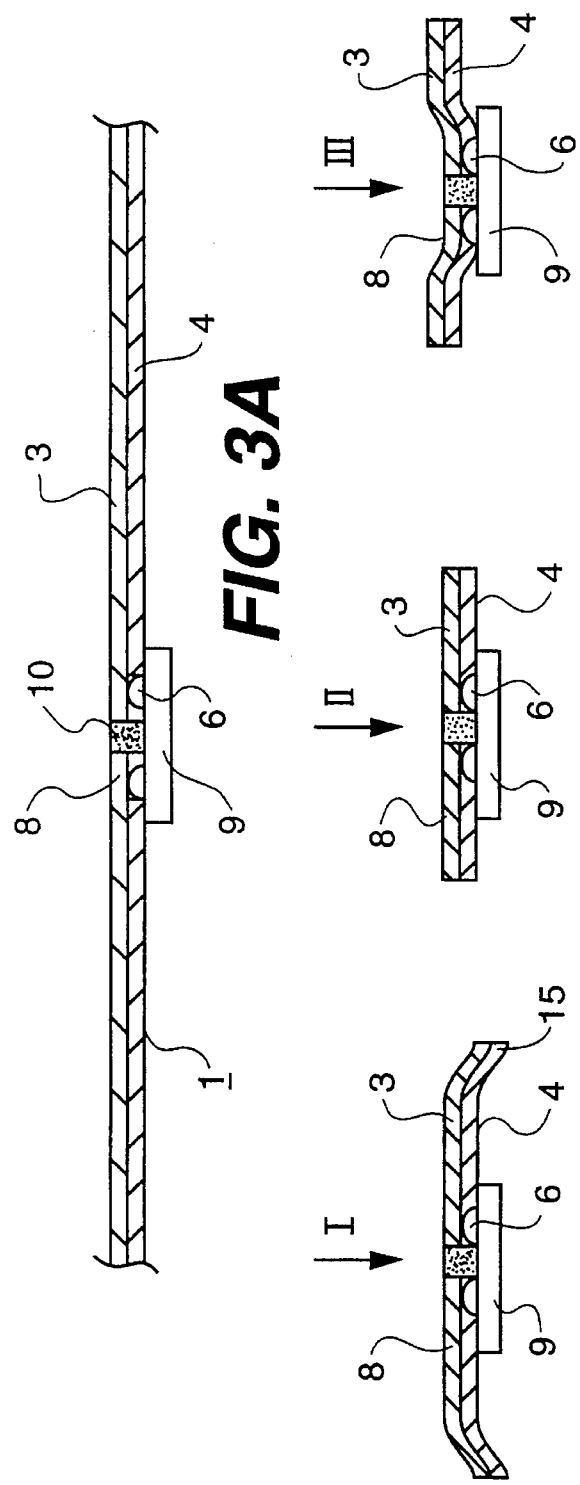

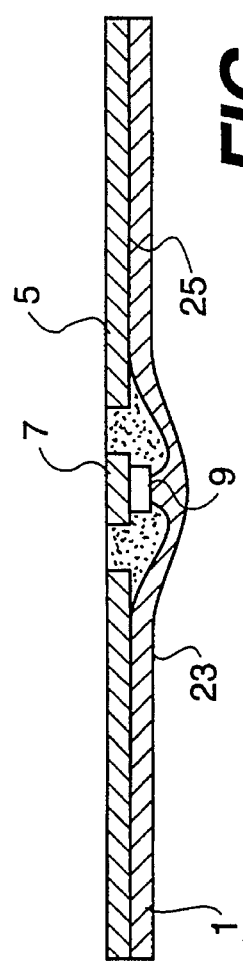
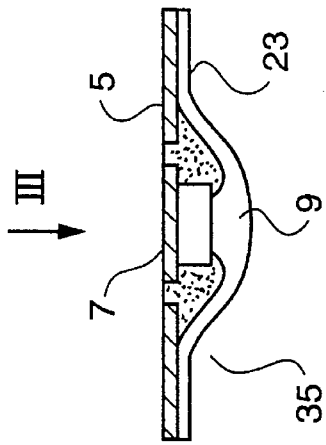
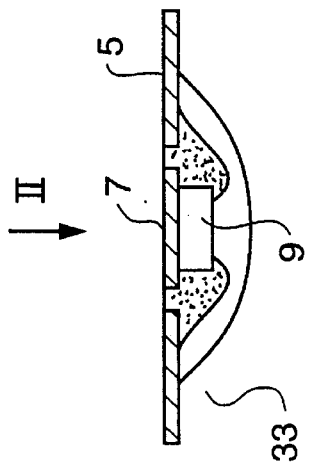
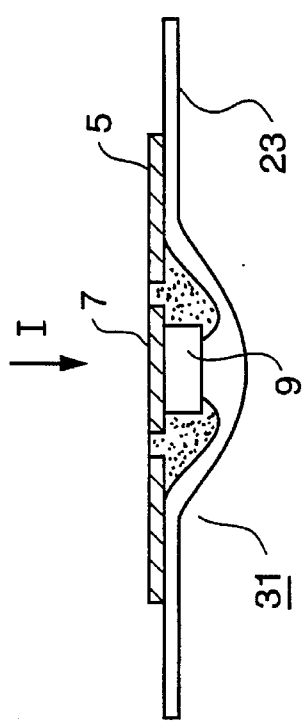
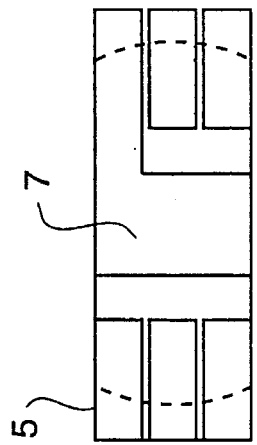
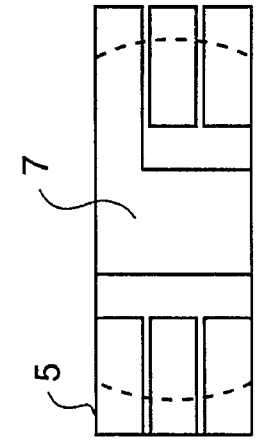
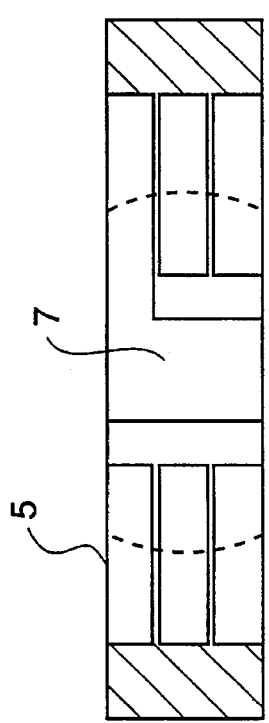

METHOD FOR PRODUCING IDENTITY CARDS HAVING ELECTRONIC MODULES

The invention relates to a method for producing data carriers having electronic modules, the electronic modules being produced separately and having an integrated circuit and contact surfaces that are electrically connected with the integrated circuit.

Data carriers having an electronic module containing an integrated circuit have been known for some time and are intended for a great variety of applications. In the course of time different techniques have been developed for implanting electronic modules in data carriers, for example identity cards or credit cards. By the so-called mounting technique a card body is first prepared with a recess in which the electronic module is inserted and glued in a separate method step. By another known technique the card body is produced by injection molding. It is thereby possible to produce data carriers having electronic modules in one method step by inserting the electronic module in the injection mold and molding around it. The electronic module has anchoring elements that are cast-in by the casting compound so that a bond arises between module and card body.

Data carriers having electronic modules produced by the mounting technique are known for example from EP-A1-0 493 738. The electronic module comprises a carrier film having on one side a conductive coating in which contact surfaces are formed by interruptions. Furthermore the carrier film has accordingly positioned windows for receiving the integrated circuit and for guiding through the electric connections from the circuit to the contact surfaces. The circuit and electric connections are cast with a casting compound in such a way as to be completely enveloped but part of the carrier film remains free of casting compound. This part can be utilized for gluing on a thermally activated adhesive ring, the window in the adhesive ring being dimensioned so that it covers at least part of the drop-shaped casting compound. The electronic module is glued into a two-step recess in the card body by means of the adhesive ring. The carrier film is located substantially in the upper part of the recess and the casting compound substantially in the lower part of the recess. The adhesive ring is located on the shoulder of the recess. Its dimensioning ensures that it covers the shoulder all over, resulting in a good and lasting bond between the module and the card body.

Identity cards having electronic modules produced by injection molding are known for example from EP-A2-0 399 868. The electronic module contains a contact layout stamped out of a metal band on which the integrated circuit is glued and electrically connected with the contact surfaces of the contact layout. The circuit and electric connections are cast with a casting compound here, too, for protection from mechanical loads. The cast body is formed so that part of the contact layout protrudes beyond its edge. The electronic module is inserted in an injection mold and held in position by positioning and fixing elements. The electronic module is then molded with plastic compound to form the data carrier. The module is anchored in the card body by means of the part of the contact layout that protrudes beyond the edge of the casting compound. A particularly firm and lasting anchoring of the electronic module in the card body is obtained if the part of the contact layout protruding beyond the edge of the casting compound is crimped so that the contact layout assumes the form of a hat and the anchoring of the module thus takes place in the interior of the card body. The part of the contact layout protruding beyond the edge of the casting compound serves solely to anchor the electronic module in the card body.

The modules known from the prior art are optimally adapted to the particular production method for the cards. This means, on the one hand, that virtually optimized cards can be produced with respect to the bond strength between the electronic module and the card body. On the other hand, optimal adaptation of the electronic modules to the production methods means that the electronic modules are fundamentally different and that the basically separate production method for the electronic modules is dependent on the production method for the card. That is, during production of the electronic module it must already be certain by which technique the card in which the module is inserted is being produced. On the other hand, the card manufacturer must provide a specially prepared module for each card technique. This restricts the flexibility in production both for the module and for the card.

The invention is therefore based on the problem of providing a method that permits greater flexibility both in the module production and in the card production, ultimately leading to a more cost-effective product.

This problem is solved by the features of the present invention.

The basic idea of the invention is first to produce a module band having neutral electronic modules and to adapt the electronic module to the card manufacturing technique only in a last method step. This last method step can take place either with the module manufacturer or with the card manufacturer and should preferably be very simple to perform.

The advantages obtained with the invention are in particular that module manufacture is completely independent of card manufacture. This substantially facilitates production of the module by a different manufacturer from the card, as is frequently the case today. The modules can be produced and stored by this manufacturer in piece numbers as high as desired, since they can be ordered and processed further by all identity card manufacturers. Also, only one tool needs to be provided for producing the unadapted electronic modules, regardless of how they are processed further, thereby lowering the costs for the module. Since the electronic modules are adapted in a last method step they are still adapted optimally to their further processing technique, so that the identity cards can be prepared without quality losses.

Further properties and advantages of the invention can be found in the subclaims and the following description of various embodiment examples, which will be explained in more detail with reference to the drawing, in which:

FIGS. 2A through 2E, 3A through 3G and 4A through 4G show module bands having electronic modules.

Figure 1:
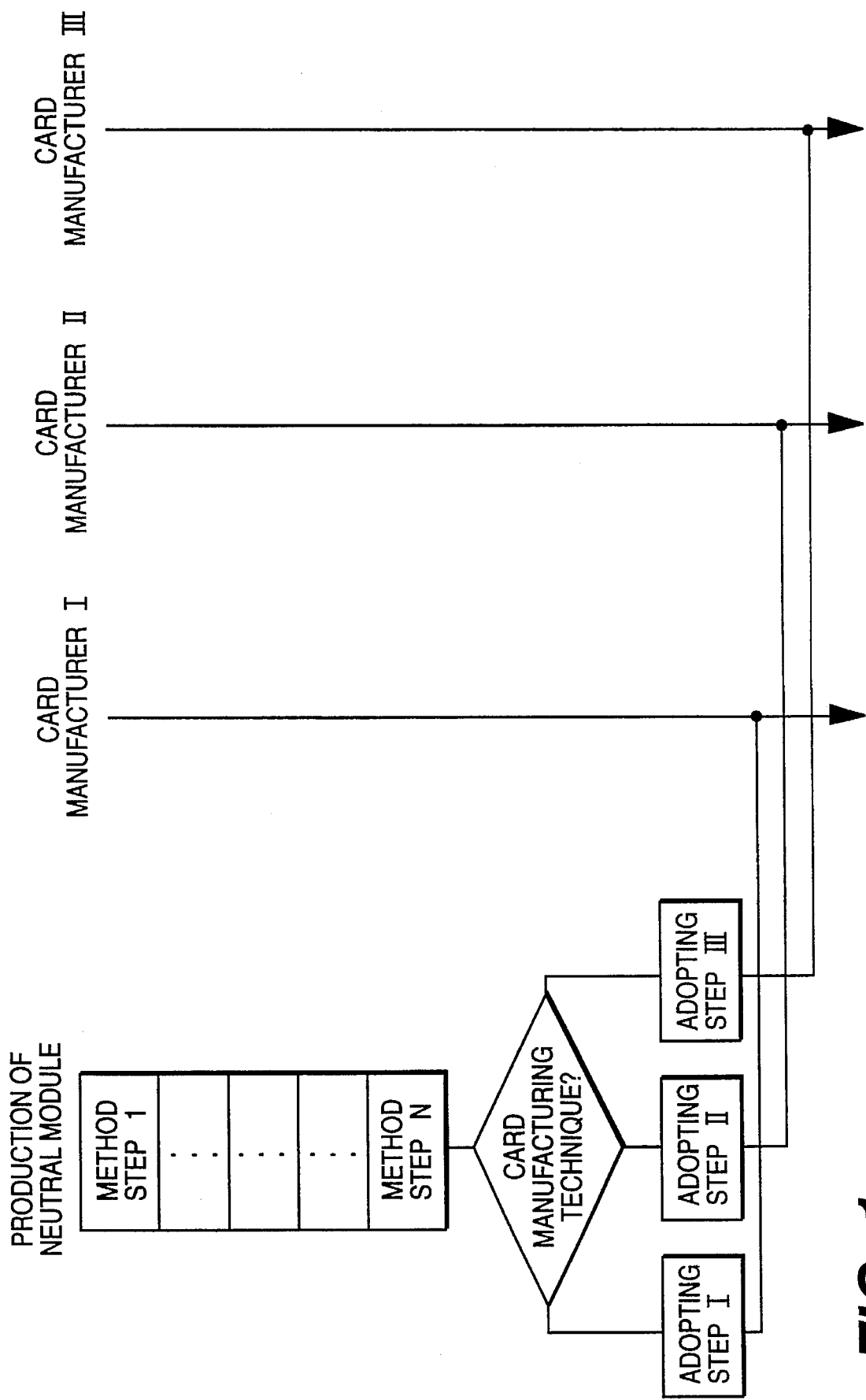
FIG. 1 shows a schematic flow chart of several production runs.

FIG. 1 shows schematically the production of an electronic module and the further processing of this electronic module with various card manufacturers. With one manufacturer of electronic modules a module band containing individual electronic modules is first produced in method steps 1–N (see FIG. 1, top left). Method steps 1–N can vary from module manufacturer to module manufacturer, the only important thing being that these method steps produce a module band having electronic modules that are initially neutral with respect to the further processing technique and can be adapted to the card manufacturing technique in a last additional method step. After completion of the module band having the neutral electronic modules it is first decided by which card manufacturing technique the electronic module is to be processed further. Depending on the further processing technique a further method step is performed on the electronic module, which is referred to as "adapting step" in FIG. 1. Adapting step I adapts the neutral electronic module for example to card manufacturing technique I, e.g. injection molding. Adapting steps II and III adapt the neutral electronic module to further production techniques, e.g. the mounting technique and the laminating technique by which the module is inserted in a multilayer card structure and connected with the card body during lamination of the card layers. The electronic module can be adapted to a certain production technique in such a way that one still has certain degrees of freedom in the production technique itself. For example it is possible to adapt a neutral electronic module to the mounting technique in such a way that it can be glued into the recess of a card body with a liquid adhesive, a contact adhesive or a thermally activated adhesive alternatively.

The abovementioned adapting steps can be performed either already with the module manufacturer or with the card manufacturer. It is particularly advantageous if the adapting step is very simple to perform. The method shown schematically in FIG. 1 permits the production of the electronic module to be completely independent of the production of the identity card.

FIGS. 2A through 2E, 3A through 3G and 4A through 4G show special designs of module bands having electronic modules that have been prepared in method steps 1 to N, and the particular adapting step to the production technique for the card. As mentioned above, method steps 1 to N can differ but they always lead to a module band having neutral electronic modules.

FIGS. 2A through 2E shows module band 1 which is prepared by the module manufacturer in method steps 1 to N as follows. Contact surfaces 5 are first stamped out of metal band 3 at equidistant intervals, one of which ends in middle bar 7 located between contact surfaces 5. Contact surfaces 5 are initially connected with the metal band via bars. An integrated circuit is glued on each middle bar 7 and electrically connected with the contact surfaces, e.g. by strip conductors 11. The thus prepared metal band is guided through an injection mold in which circuit 9 and electric connections 11 are cast in a block.

Method steps 1–N are therefore over (see FIG. 1) and the module band finished so that it can be supplied to the various card manufacturers.

Figure 2A:
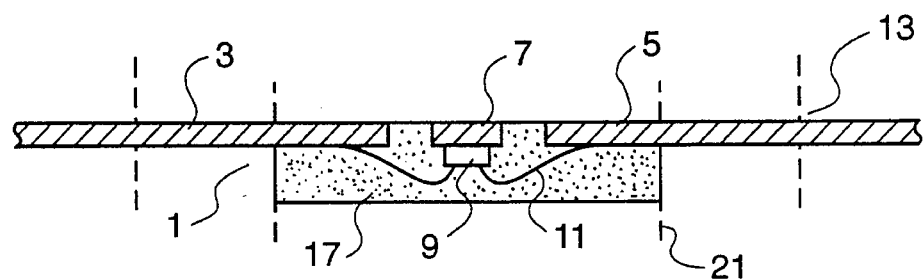
Figure 2B:
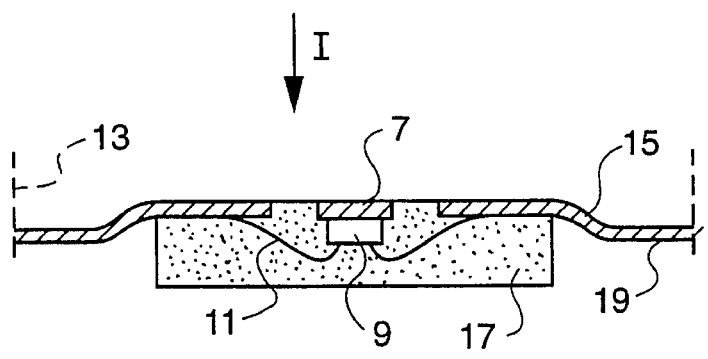
Figure 2C:
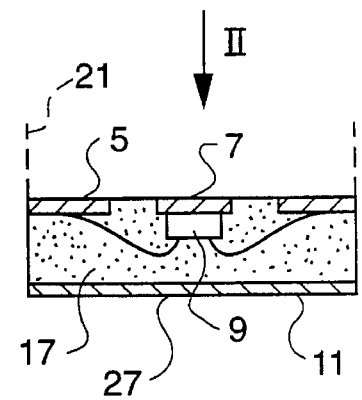
Figure 2D:
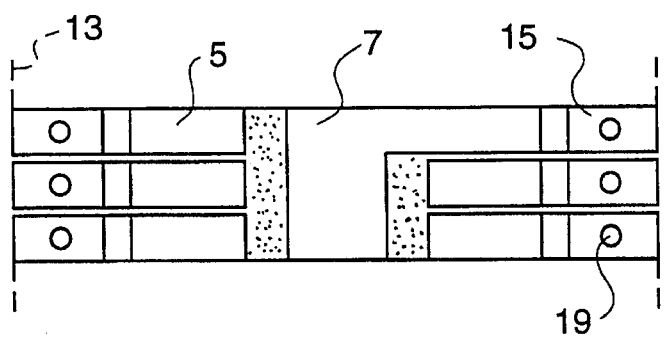
Figure 2E:
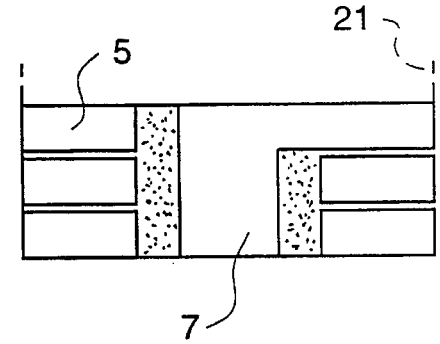

The manufacturer producing the cards by injection molding now conducts an adapting step for specifying the electronic module for injection molding (branch I in FIGS. 2C and 2E). For this purpose it stamps the individual modules out of the module band along stamping edges 13 so that prolongations 15 of contact surfaces 5 protrude beyond cast body 17 in the individual modules. During the stamping operation windows 19 can be produced simultaneously in the prolongations of the contact surfaces. Finally, in a last method step prolongations 15 are crimped as shown in the Figure. This method step can optionally also take place simultaneously with the stamping operation. The adapted electronic module can now be processed further by injection molding known in the art.

The manufacturer producing the card by the mounting technique likewise conducts an adapting step that specifies the module for the mounting technique (branch II in FIGS. 2C and 2E). However this adapting step differs from the abovementioned adapting step. First the individual modules are stamped out along stamping edge 21 and provided in a last method step with adhesive 27 which can be contact adhesive or thermally activated adhesive. The now finished electronic module can be inserted in the recess of a prepared card body by the mounting technique and glued there.

FIGS. 3A through 3G show further module band 1 that can be prepared by the module manufacturer in method steps 1 to N. Contact surfaces 5 are first stamped out of metal band 3 at equidistant intervals, precisely as in FIGS. 2A through 2E; and initially remain connected with the metal band by bars. The metal band is then optionally brought together with adhesive strip 4 and glued. Adhesive strip 4 contains windows at equidistant intervals through which bumps 6 of circuit 9 are guided and electrically connected with contact fingers 8 of contact surfaces 5. Circuit 9 is glued partly to adhesive strip 4. Finally the area between bumps 6 is cast at least partly with resin 10 from the side of metal band 3. Casting of the circuit can be dispensed with in this embodiment example since there are no sensitive strip conductors connecting the circuit with the contact surfaces. The finished module band can now be supplied to the card manufacturer.

If the electronic module is to be processed further by injection molding it is adapted virtually to this technique as already shown in FIGS. 2A through 2E. (see branch I in FIGS. 3B through 3E). Prolongations 15 protruding beyond contact surfaces 5 can be dovetailed (see plan view 29) so that this shaping already permits anchoring in an injection-molded card body.

If the electronic module is to be processed further by the mounting technique it is stamped out of the module band along the contact surfaces so that prolongations 15 are no longer located on the module (see branch II in FIGS. 3C and 3F). The individual module can now be glued into a two-step recess in a prepared card body with the aid of adhesive 4, which can be contact adhesive, thermally activated adhesive, a thermoplast or a film with an adhesive layer. If adhesive strip 4 is dispensed with in the production of the module band the electronic module can also be glued into the recess with a liquid adhesive, for example, which is applied to the contact surfaces point by point and spreads under the contact surfaces during gluing.

If the electronic module is to be processed further by the laminating technique (see branch III in FIGS. 3D and 3G), it is likewise stamped out of the module band along the contact surfaces. In contrast to the mounting technique, however, the contact surfaces are crimped slightly upward here so that the electronic module can be laminated into a multilayer card structure. This can be done for example by providing a layer with windows for the upwardly crimped contact surfaces, a further layer with a window for receiving the integrated circuit, and an uninterrupted layer. The electronic module is inserted accordingly into this layer structure, after which the layers are interconnected by lamination and a finished data carrier arises. Separate crimping of the layers can optionally be dispensed with since the contact surfaces are automatically pressed onto the surface of the card by the above-described layer structure during lamination.

FIGS. 4A through 4G show a further embodiment example for module band 1 which is prepared in method steps 1 to N. Metal band 3 is again provided from which contact surfaces 5 are first stamped out that initially remain connected with the metal band by bars. The metal band is then provided detachably with carrier foil 23 that contains a window in the central area of contact surfaces 5 and is stamped beyond the contact surfaces (see gap 25 in FIG. 4A). In a further step circuits 9 are glued on the metal band in the window of carrier foil 23, as shown in FIGS. 4A through 4D, and electrically connected with the bumps. Finally the circuit and electric connections are cast with a casting compound which is drop-shaped here. The delimitation of the window in carrier foil 23 can serve as a limiting frame for the casting compound.

If the now finished electronic module is to be processed further by injection molding or laminating (see branch I in FIGS. 4B and 4E), metal band 3 is first connected intimately with the carrier foil in the area of contact surfaces 5. The bars still connecting contact surfaces 5 with the metal band and the bars in area 25 still interconnecting the carrier foil elements are then stamped through, resulting in one electronic module as side view 31 or plan view 29 shows. In this module the part of carrier foil 23 protruding beyond the contact surfaces serves as an anchoring frame that can be utilized both for anchoring the electronic module in injection molded-cards and for anchoring the module in laminated multilayer cards. The anchoring frame can optionally also be provided with windows, which permits better anchoring.

If the electronic module is to be processed further by the mounting technique there are two possibilities (branches II and III) for adapting it to the technique. The first is to lift the module directly off the carrier foil, resulting in one module as side view 33 shows. This module can be glued into a two-step recess in a prepared card body with the aid of a liquid adhesive. If metal band 3 or contact surfaces 5 are thin enough it is also possible to insert the casting compound of the module in a blind hole in a card body and glue the contact surfaces directly on the surface of the card.

A further possibility (branch III) is to interconnect metal band 3 intimately with carrier foil 23 in the area of contact surfaces 5 and to stamp out the electronic module along the contact surfaces, resulting in one module as side view 35 shows. This module can again be glued into a two-step recess, which can be done with the aid of carrier foil ring 23 that can be provided for this purpose e.g. with a thermally activated adhesive layer.

We claim:

1. A method for producing data carriers having electronic modules, the electronic modules being produced separately and having an integrated circuit and contact surfaces that are electrically connected with the integrated circuit, comprising the steps of:

preparing a band containing individual electronic modules connected with said band independent of the technique by which said electronic modules are connected with said data carriers, said step of preparing said band including the steps of stamping contact surfaces for each of said individual electronic modules out of a metal band with said contact surfaces initially connected with said metal band by bars, and positioning an integrated circuit on said contact surfaces required for an individual electronic module and electrically connecting said contact surfaces with said integrated circuit;

removing an electronic module from said band in a manner adapted to the technique by which said electronic module is connected with a data carrier; and connecting said electronic module with said data carrier, said connecting step including stamping said modules out of said band along said contact surfaces by severing said bars connecting said modules with said band.

2. The method for producing data carriers of claim 1, wherein said module is glued into a recess in a prepared card body.

3. The method for producing data carriers of claim 1, wherein a contact adhesive or thermally activated adhesive is located on said electronic module and is utilized for gluing said module.

4. The method for producing data carriers of claim 2 wherein a liquid adhesive that connects said contact surfaces directly with said card body is utilized for gluing said module.

5. A method for producing data carriers having electronic modules, the electronic modules being produced separately and having an integrated circuit and contact surfaces that are electrically connected with the integrated circuit, comprising the steps of:

preparing a band containing individual electronic modules connected with said band independent of the technique by which said electronic modules are connected with said data carriers, said steps of preparing said band including the steps of stamping contact surfaces for each of said individual electronic modules out of a metal band with said contact surfaces initially connected with said metal band by bars, and positioning an integrated circuit on said contact surfaces required for an individual electronic module and electrically connecting said contact surfaces with said integrated circuit;

removing an electronic module from said band in a manner adapted to the technique by which said electronic module is connected with a data carrier; and connecting said electronic module with said data carrier, said connecting step including stamping said modules out of said band along an area protruding beyond said contact surfaces by severing said bars connecting said modules with said band and forming said data carrier whereby said electronic module is mounted therein via said protruding area.

6. The method for producing data carriers of claim 5, wherein said step of connecting said module with said data carrier includes at least one of molding said module with a plastic compound to form a data carrying card and incorporate said module in a multilayer structure that is laminated into a data carrying card together with said module.

7. The method for producing data carriers of claim 6 wherein said steps of stamping said modules out of said band along an area protruding beyond the contact surfaces and forming said data carrier include the steps of forming prolongations of said contact surfaces and crimping said prolongation in the direction of the integrated circuit to anchor said electronic module in an interior of said card when molding said module with a plastic compound.

8. The method for producing data carriers of claim 6, wherein said steps of stamping said modules out of said band along an area protruding beyond the contact surfaces and forming said data carrier include forming said area in a separate layer on which the contact surfaces lie.

9. The method for producing data carriers of claim 7, wherein said steps of stamping said modules out of said band along an area protruding beyond the contact surfaces and forming said data carrier further include forming said area with windows through which card material penetrates when said electronic module is anchored in said card.

* * * * *